(12) United States Patent
Chang et al.

(10) Patent No.: US 7,786,779 B2
(45) Date of Patent: Aug. 31, 2010

(54) BUFFER FOR DRIVING CIRCUIT AND METHOD THEREOF

(75) Inventors: Yaw-Guang Chang, Tainan County (TW); Chin-Feng Hsu, Tainan County (TW)

(73) Assignee: Himax Technologies Limited, Fonghua Village, Sinshih Township, Tainan County (TW)

( * ) Notice: Subject to any disclaimer, the term of this patent is extended or adjusted under 35 U.S.C. 154(b) by 0 days.

(21) Appl. No.: 12/349,501

(22) Filed: Jan. 6, 2009

(65) Prior Publication Data

US 2010/0171538 A1 Jul. 8, 2010

(51) Int. Cl.
*H03K 5/12* (2006.01)
(52) U.S. Cl. .................. 327/170; 327/108; 327/112
(58) Field of Classification Search .......... 327/108, 327/112, 170, 380, 381; 326/83, 86
See application file for complete search history.

(56) References Cited

U.S. PATENT DOCUMENTS

| 6,225,844 | B1* | 5/2001 | Fujiwara | 327/170 |
| 6,606,271 | B2* | 8/2003 | Hunt | 365/189.05 |
| 7,049,863 | B2* | 5/2006 | Bechman et al. | 327/112 |
| 7,164,298 | B2* | 1/2007 | Sung | 327/112 |

* cited by examiner

*Primary Examiner*—Hai L Nguyen
(74) *Attorney, Agent, or Firm*—Winston Hsu

(57) ABSTRACT

A buffer for a driving circuit includes a first transistor, a second transistor and a slew rate controlling circuit. The first transistor serves to provide a current to an output terminal. The second transistor serves to sink a current from the output terminal. The slew rate controlling circuit serves to control slew rate of at least one of the first transistor and the second transistor according to the input signal. The managing circuit serves to prevent the first transistor and the second transistor from turning on simultaneously.

8 Claims, 4 Drawing Sheets

BUFFER FOR DRIVING CIRCUIT AND METHOD THEREOF

BACKGROUND OF THE INVENTION

1. Field of the Invention

The present invention relates to a driving circuit buffer and a method thereof, and particularly relates to a driving circuit buffer that includes a slew rate controlling circuit to provide proper driving power, and method thereof.

2. Description of the Prior Art

Conventionally, a driving circuit always includes a buffer as a final stage for providing proper driving power to the loading coupled to the buffer. However, the loading value varies with different structures, materials and different input signals, and the output signal of the buffer also varies with different loading. Accordingly, if the output signal of the buffer must follow certain standards such as Mobile Industry Processor Interface standard (MIPI) (for example, the slew rate thereof cannot exceed a predetermined value), the output signal of the buffer should not vary with the loading unlimitedly.

SUMMARY OF THE INVENTION

One objective of the present invention is therefore to provide a driving circuit buffer that can provide proper output signal regardless of the variation in loading.

One embodiment of the present invention provides a buffer for a driving circuit. The buffer includes a first transistor, a second transistor and a slew rate controlling circuit. The first transistor serves to provide a current to an output terminal. The second transistor serves to sink a current from the output terminal. The slew rate controlling circuit serves to control slew rate of at least one of a plurality of controlling signals for controlling the turning on and turning off operations of the first transistor and the second transistor according to the input signal. The managing circuit serves to prevent the first transistor and the second transistor from turning on simultaneously.

Another embodiment of the present invention provides a driving method for a loading device. The driving method includes: (a) providing a first transistor, for providing a current to an output terminal; (b) providing a second transistor, for sinking a current from the output terminal; (c) controlling a slew rate of at least one of the first transistor and the second transistor according to the input signal to generate and output signal input to the loading device; and (d) preventing the first transistor and the second transistor from turning on simultaneously.

According to the above-mentioned description, the slew rate of the output signal can be well controlled thus an output signal with proper slew rate can be provided.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the germs "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
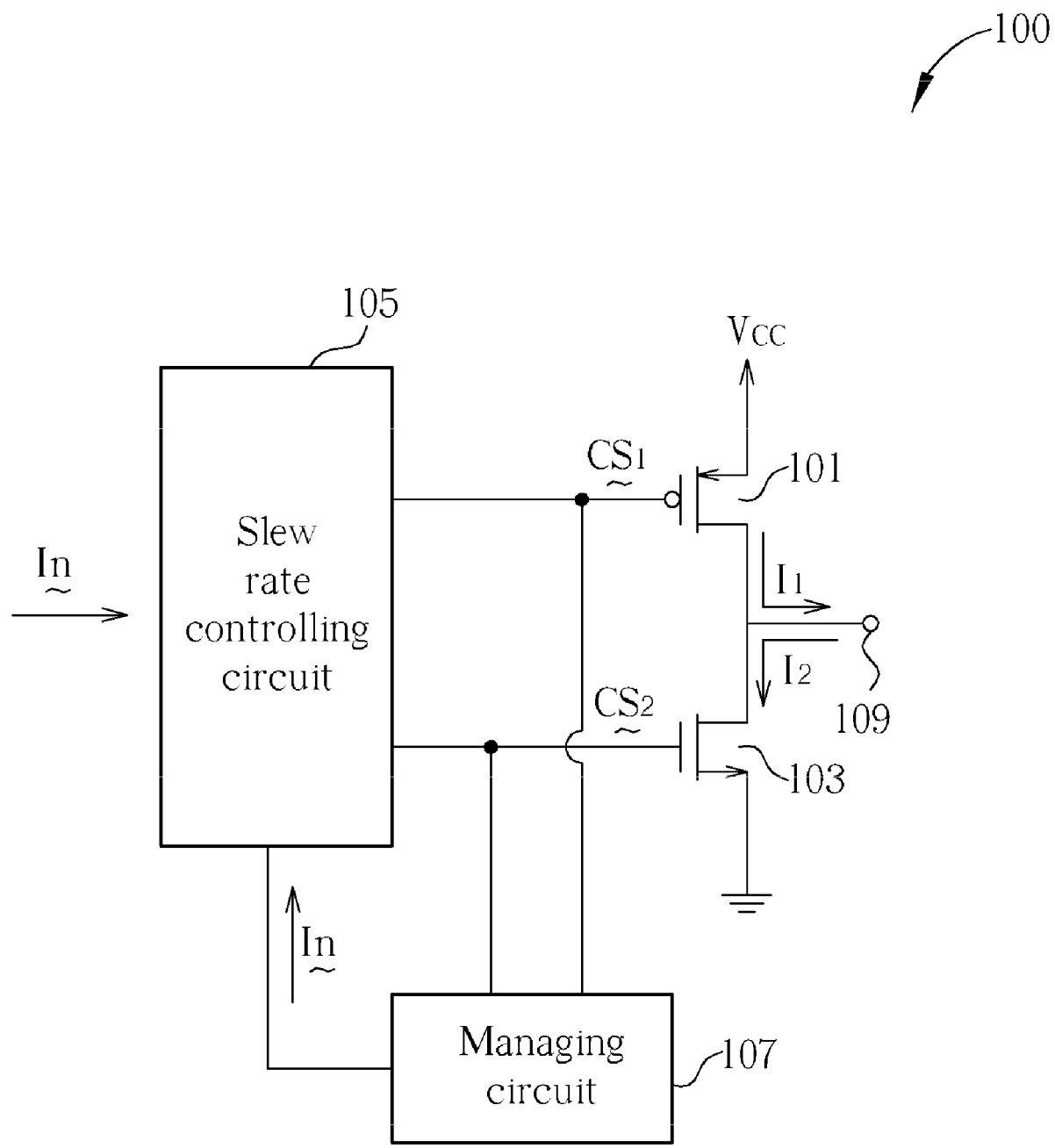
FIG. 1 is a circuit diagram illustrating a buffer of a driving circuit, according to an embodiment of the present invention.

FIG. 1 is a circuit diagram illustrating a buffer 100 of a driving circuit, according to an embodiment of the present invention. As shown in FIG. 1, the buffer 100 includes a first transistor 101, a second transistor 103, a slew rate controlling circuit 105, and a managing circuit 107. The first transistor 101 serves to provide a current $I_1$ to an output terminal 109. The second transistor 103 serves to sink a current $I_2$ from the output terminal 109. In this case, a loading device (not illustrated) is coupled to the output terminal 109, such that a loading current is provided from the output terminal 109 to the loading device. The slew rate controlling circuit 105 controls a slew rate of at least one of the controlling signal s $CS_1$ and $CS_2$ for controlling the turning on and turning off operations of the first transistor 101 and the second transistor 103 according to the input signal In. Please note that the input signal In can be from the managing circuit 107 or other sources, depending on the structure of the managing circuit 207.

In this embodiment, if the transistors 101 and 103 turn on at the same time, a large current will flow from the predetermined voltage level $V_{cc}$ to ground, such that the first transistor 101 and the second transistor 103 may break. Accordingly, the managing circuit 105 is provided to prevent the first transistor and the second transistor from turning on simultaneously. In this embodiment, the first transistor 101 is a P MOSFET (Metal Oxide Semiconductor Field Effect Transistor) having a source terminal coupled to a predetermined voltage level, and the second transistor 103 is an N MOSFET having a drain terminal coupled to a drain terminal of the first transistor 101, and having a source terminal coupled to a ground level.

Figure 2:
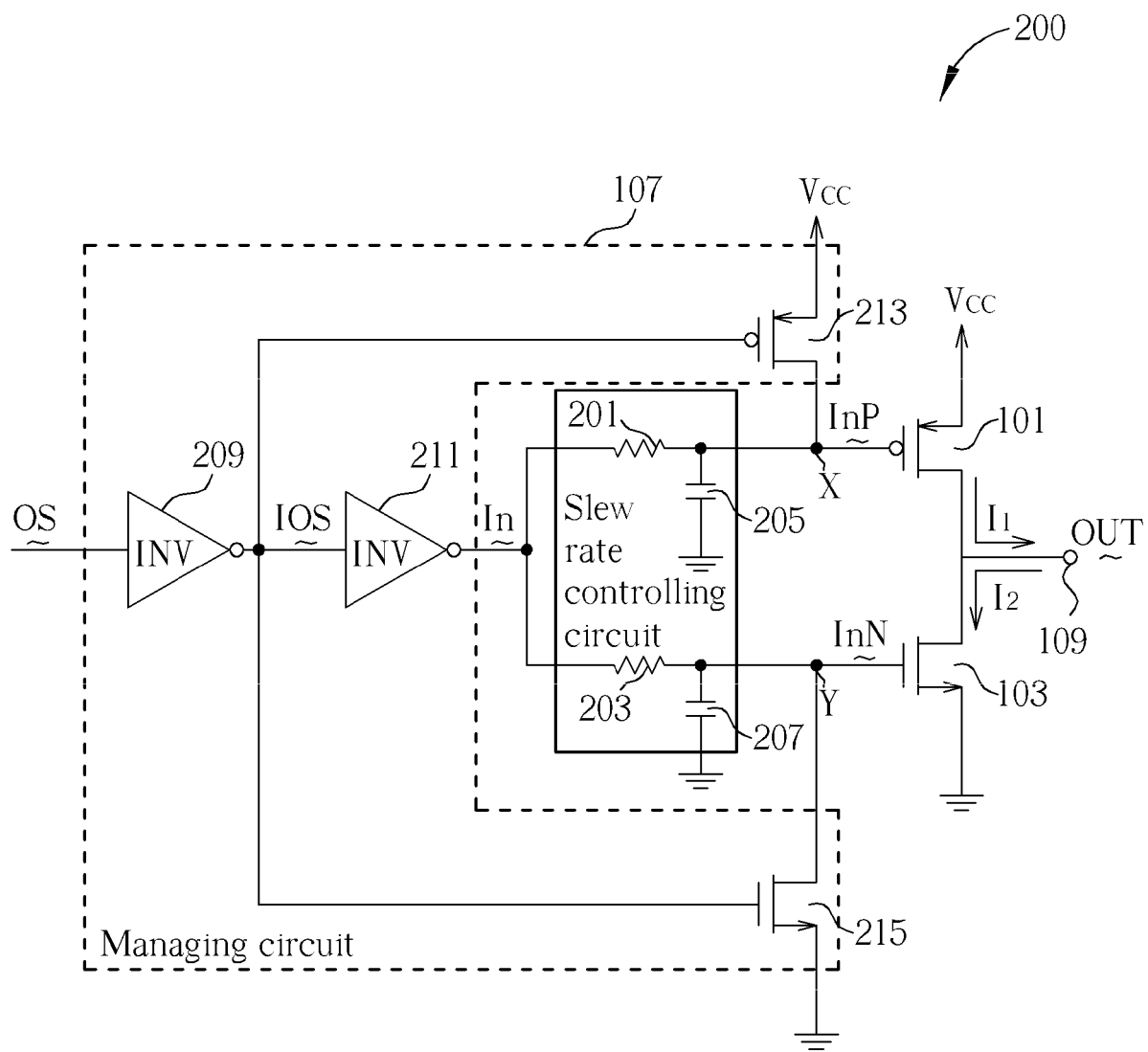
FIG. 2. is a circuit diagram illustrating an example of detailed structures of the buffer of the driving circuit shown in FIG. 1.

FIG. 2 is a circuit diagram illustrating an example of detailed structures of the buffer of the driving circuit shown in FIG. 1. It should be noted that the structures shown in FIG. 2 are only for example purposed and are not meant to limit the scope of the present invention. In this embodiment, the slew rate controlling circuit 105 is a delay circuit including resistors 201, 203 and capacitors 205, 207, such that the input signal In from the managing circuit 107 can be delayed to control the slew rate of at least one of the control signals InP and InN (i.e the controlling signals $CS_1$ and $CS_2$ in FIG. 1). Additionally, the managing circuit 107 in this embodiment includes inverters 209, 211, a P MOSFET 213, and an N MOSFET 215. The inverter 209 serves to invert an original signal OS to generate an inverted original signal IOS. The inverter 211 serves to invert the inverted original signal IOS to generate the input signal In. The P MOSFET 213 has a drain terminal coupled to a gate terminal of the P MOSFET 101, a source terminal coupled to a specific voltage level and a gate terminal receiving the inverted original signal IOS. The N MOSFET 215 has a drain terminal coupled to a gate terminal of the N MOSFET 103, a source terminal coupled to the ground voltage level, and a gate terminal that receives the inverted original signal IOS.

Figure 3:
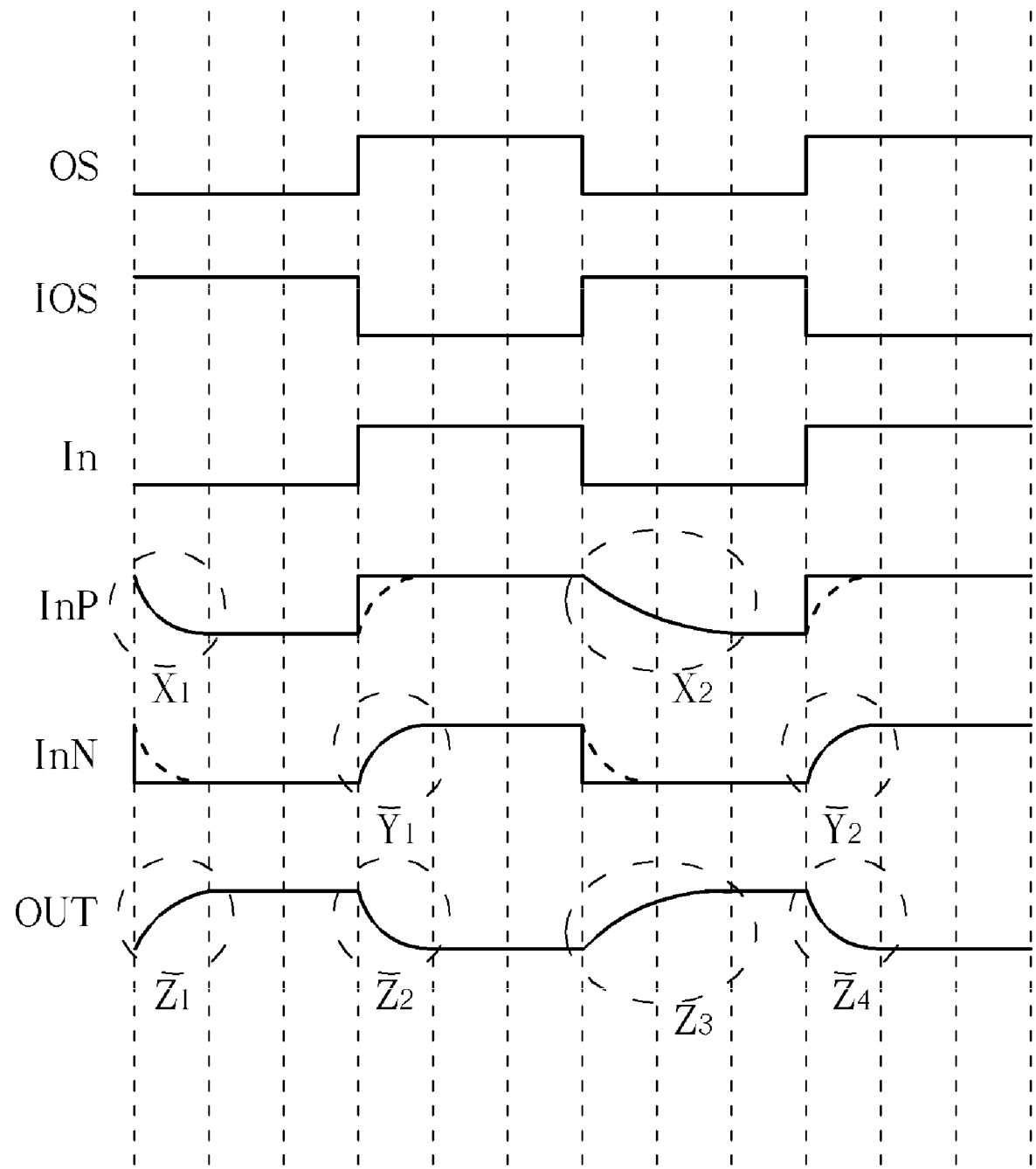
FIG. 3 is a schematic diagram illustrating signal relations of the embodiment shown in FIG. 2.

FIG. 3 is a schematic diagram illustrating signal relations of the embodiment shown in FIG. 2. Please jointly refer to FIG. 2 and FIG. 3 to understand the present invention more clearly. As shown in FIG. 3, the original signal OS is inverted by the inverter 209 to generate an inverted original signal IOS, such that the inverted original signal IOS has an inverted phase of the original signal OS. The inverted original signal IOS is then inverted again to generate the input signal In. Accordingly, the input signal In has the same phase as the original signal OS. Next, the slew rate controlling circuit 105 delays the input signal In to respectively generate the controlling signal InP and InN to the transistors 101 and 103. As shown in FIG. 3, the controlling signal InP and InN have a plurality of delay sections $X_1$, $X_2$ and $Y_1$, $Y_2$. The transistors 101 and 103 are controlled by the controlling signals InP and InN. Therefore an output signal OUT is generated according to the operations of the transistors 101 and 103.

As shown in FIG. 3, the slew rates of the sections $Z_1$, $Z_2$ respectively correspond to the slew rates of the sections $X_1$ and $Y_1$. Similarly, the slew rates of the sections $Z_3$, $Z_4$ respectively correspond to the slew rates of the sections $X_2$ and $Y_2$. Therefore, via controlling the slew rates of the controlling signals InP and InN, the slew rates of the output signal Out can be well controlled. However, it should be noted that the slew rate controlling circuit 105 is not limited to a delay circuit such as an RC circuit. Other circuits that can reach the same function should also fall within the scope of the present invention. The solid and dotted lines in regions $K_1$~$K_4$ respectively indicate the voltage curves with the existence of the P MOSFET 213, the N MOSFET 215, and without the P MOSFET 213, the N MOSFET 215. As shown in FIG. 3, it is apparent that the rising speed and falling speed of the solid lines are faster than which of the dotted lines. Thus, the P MOSFET 213, the N MOSFET 215 can help transistors 101 and 103 turn on/off quickly.

Specifically, the P MOSFET 213 and the N MOSFET 215 are controlled by the inverted original signal IOS that is not delayed by the slew rate controlling circuit 105. Accordingly, the P MOSFET 213 and the N MOSFET 215 can turn on/off before the turn on/off operations of the transistors 101 and 103. Thus the voltage at X and Y can be pulled to $V_{cc}$ or pulled down to ground quickly, and the transistor 101 and 103 turn off rapidly. Thereby the transistors 101 and 103 can be prevented from turning on at the same time.

Figure 4:
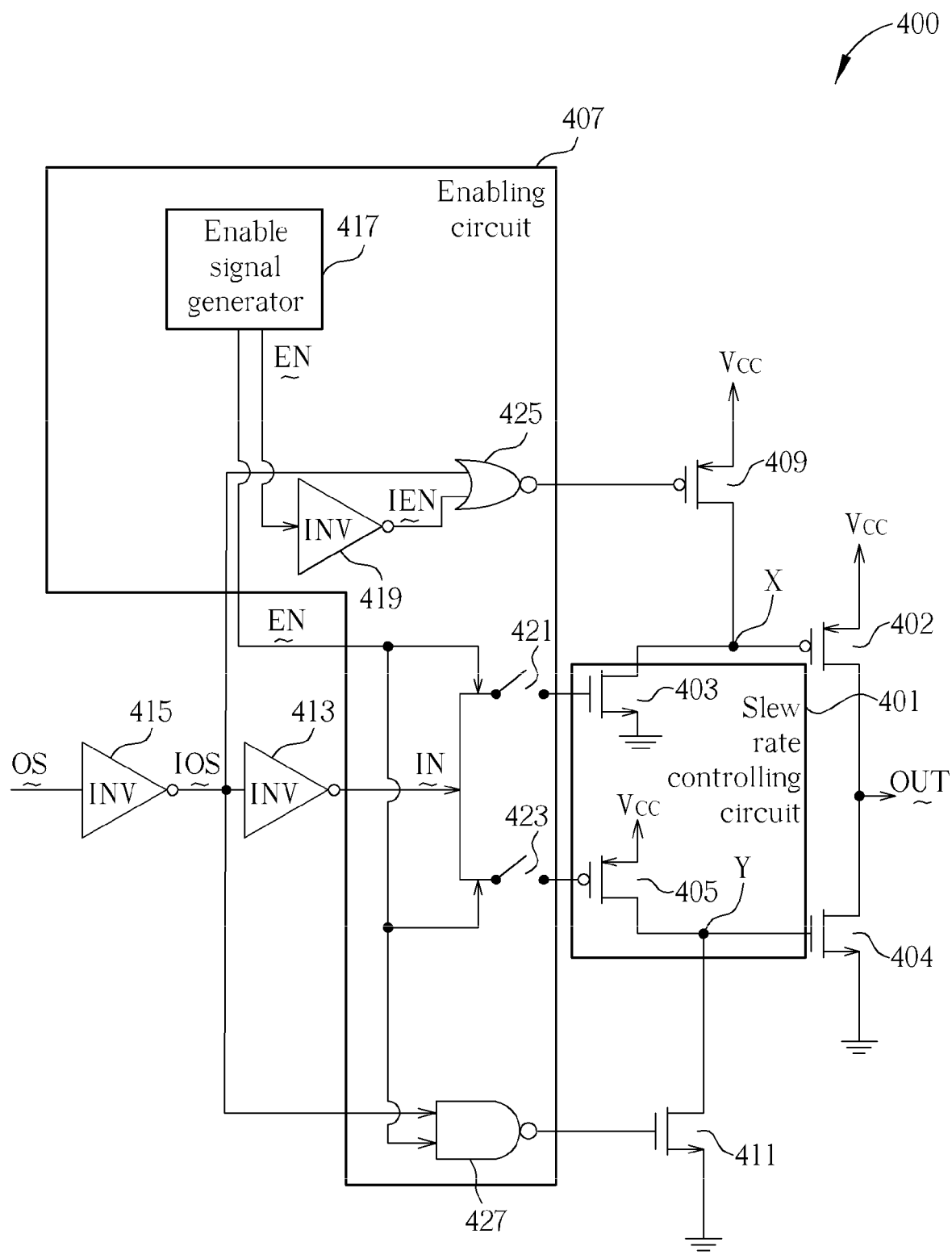
FIG. 4 is a circuit diagram illustrating another example of detailed structures of the buffer of the driving circuit shown in FIG. 1.

FIG. 4 is a circuit diagram illustrating another example of detailed structures of the buffer of the driving circuit shown in FIG. 1. Compared with the embodiments shown in FIG. 2, the slew rate controlling circuit 401 includes an N MOSFET 403 and a P MOSFET 405, instead of resistors and capacitors. As known by persons skilled in the art, a MOSFET can reach the same functions of a RC delay circuit corresponding to the size of the MOSFET, thus the RC delay circuit can be replaced. In one embodiment, MOSFETs with long channel length are utilized as the N MOSFET 403 and the P MOSFET 405 to replace the RC delay circuit.

That is, the N MOSFET 403 and the P MOSFET 405 can be utilized to control the slew rate at the points X and Y via adjusting the size of the N MOSFET 403 and the P MOSFET 405. For example, the N MOSFET 403 can be utilized to control the rising speed of the signal at the point X, such that the rising edge of the output signal OUT can be generated. Additionally, the P MOSFET 405 can be utilized to control the rising speed of the signal at the point Y, such that the falling edge of the output signal OUT can be generated. Furthermore, the buffer 400 shown in FIG. 4 further includes an enabling circuit 407 for enabling or disabling the slew rate controlling circuit 401 and a controlling circuit including the PMOSFET 409, the NMOSFET 411 and the inverters 413 and 415. In this case, the enabling circuit 407 includes an enable signal generator 417, and inverter 419, switch devices 421, 423, a NOR gate 425, and a NAND gate 427.

The enable signal generator 407 generates an enable signal EN. The inverter 419 generates an inverted enable signal IEN. The switch devices 421 and 423 operate according to the enable signal EN. The NOR gate 425 receives the inverted original signal IOS and the inverted enable signal IEN, and has an output coupled to a gate terminal of the P MOSFET 409. The NAND gate 427 receives the inverted original signal IOS and the enable signal EN, and has an output coupled to a gate terminal of the N MOSFET 411. Via this structure, the slew rate controlling circuit 401 and the managing circuit including the P MOSFET 409, the N MOSFET 411 and the inverters 413 and 415 can be enabled or disabled by the enabling signal EN.

In addition, in order to provide enough driving power for heavy loading, the type of MOSFETs utilized for the transistors 101, 103 shown in FIGS. 1 and 2 or the transistors 402, 404 shown in FIG. 4 can be well selected such that the transistors can provide large currents. In one embodiment, MOSFETs with long channel width are provided as the transistors 101, 103 shown in FIGS. 1 and 2 or the transistors 402, 404 shown in FIG. 4. Since the current of the MOSFET is proportional to the ratio (W/L) (ex. a current function Id=1/2 u Cox (W/L) ($V_{gs}$–$V_t$)/2), as known by persons skilled in the art, the MOSFET with higher ratio (W/L) provide large currents and larger slew rate can be provided accordingly.

According to the above-mentioned description, the slew rate of the output signal can be well controlled thus an output signal with proper slew rate can be provided. Furthermore, since MOSFETs with long channel width or length are used, the output signal will not be easily affected even when the output signal is applied to a heavy loading.

Those skilled in the art will readily observe that numerous modifications and alterations of the device and method may be made while retaining the teachers of the invention.

What is claimed is:

1. A buffer for a driving circuit, comprising:
   a first transistor, for providing a current to an output terminal;
   a second transistor, coupled to the first transistor, for sinking a current from the output terminal, wherein the first transistor is a first P MOSFET having a source terminal coupled to a predetermined voltage level, the second transistor is a first N MOSFET having a drain terminal coupled to a drain terminal of the first P MOSFET, and having a source terminal coupled to a ground level;
   a slew rate controlling circuit, coupled to the first transistor, the second transistor and an input signal, for controlling slew rate of at least one controlling signal for controlling the turning on and turning off operations of the first transistor and the second transistor according to the input signal;
   a managing circuit, coupled to the first transistor and the second transistor, for preventing the first transistor and the second transistor from turning on simultaneously, wherein the managing circuit includes:
  a first inverter, for inverting an original signal to generate an inverted original signal;
  a second inverter for inverting the inverted original signal to generate the input signal;
  a second P MOSFET, having a drain terminal coupled to a gate terminal of the first P MOSFET, a source terminal coupled to a specific voltage level and a gate terminal for receiving the inverted original signal; and
  a second N MOSFET, having a drain terminal coupled to a gate terminal of the first N MOSFET, a source terminal coupled to the ground voltage level, and a gate terminal for receiving the inverted original signal; and
an enabling circuit, for enabling or disabling the slew rate controlling circuit and the managing circuit, comprising:
  an enable signal generator, for generating an enable signal;
  a third inverter, coupled to the enable signal generator, for generating an inverted enable signal;
  at least one switch device, coupled to the slew rate controlling circuit and the enable signal generator, for operating according to the enable signal;
  a NOR gate, for receiving the inverted original signal and the inverted enable signal having an output coupled to a gate terminal of the second P MOSFET; and
  a NAND gate, for receiving the inverted original signal and the enable signal having an output coupled to a gate terminal of the second N MOSFET.

2. A buffer for a driving circuit, comprising:
a first transistor, for providing a current to an output terminal;
a second transistor, coupled to the first transistor, for sinking a current from the output terminal;
a slew rate controlling circuit, coupled to the first transistor, the second transistor and an input signal, for controlling slew rate of at least one controlling signal for controlling the turning on and turning off operations of the first transistor and the second transistor according to the input signal;
a managing circuit, coupled to the first transistor and the second transistor, for preventing the first transistor and the second transistor from turning on simultaneously; and
an enabling circuit, for enabling or disabling the slew rate controlling circuit and the managing circuit, comprising:
  an enable signal generator, for generating an enable signal;
  a third inverter, coupled to the enable signal generator, for generating an inverted enable signal;
  at least one switch device, coupled to the slew rate controlling circuit and the enable signal generator, for operating according to the enable signal;
  a NOR gate, for receiving the inverted original signal and the inverted enable signal having an output coupled to a gate terminal of the second P MOSFET; and
  a NAND gate, for receiving the inverted original signal and the enable signal having an output coupled to a gate terminal of the second N MOSFET.

3. The buffer of claim 2, wherein the slew rate controlling circuit includes:
  a third N MOSFET, having a drain terminal coupled to a gate terminal of the first P MOSFET, and having a source terminal coupled to the ground voltage level; and
  a third P MOSFET, having a drain terminal coupled to a gate terminal of the first N MOSFET, and having a drain terminal coupled to a predetermined voltage level.

4. The buffer of claim 2, further comprising a first inverter for inverting an original signal to generate an inverted original signal and a second inverter for inverting the inverted original signal to generate the input signal.

5. The buffer of claim 2, wherein the first transistor is a first P MOSFET having a source terminal coupled to a predetermined voltage level, the second transistor is a first N MOSFET having a drain terminal coupled to a drain terminal of the first P MOSFET, and having a source terminal coupled to a ground level.

6. The buffer of claim 5, wherein the managing circuit includes:
  a first inverter, for inverting an original signal to generate an inverted original signal;
  a second inverter for inverting the inverted original signal to generate the input signal;
  a second P MOSFET, having a drain terminal coupled to a gate terminal of the first P MOSFET, a source terminal coupled to a specific voltage level and a gate terminal for receiving the inverted original signal; and
  a second N MOSFET, having a drain terminal coupled to a gate terminal of the first N MOSFET, a source terminal coupled to the ground voltage level, and a gate terminal for receiving the inverted original signal.

7. The buffer of claim 2, wherein the slew rate controlling circuit is a delay circuit for delaying the input signal to generate a delayed input signal to control the first transistor and the second transistor.

8. The buffer of claim 7, wherein the slew rate controlling circuit is an RC delay circuit.

* * * * *